United States Patent
Grousset et al.

(10) Patent No.: US 10,270,420 B2
(45) Date of Patent: Apr. 23, 2019

(54) SURFACE ELASTIC WAVE DEVICE COMPRISING A SINGLE-CRYSTAL PIEZOELECTRIC FILM AND A CRYSTALLINE SUBSTRATE WITH LOW VISOELASTIC COEFFICIENTS

(71) Applicant: COMMISSARIAT A L'ENERGIE ATOMIQUE ET AUX ENERGIES ALTERNATIVES, Paris (FR)

(72) Inventors: Sébastien Grousset, Grenoble (FR); Sylvain Ballandras, Besançon (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 261 days.

(21) Appl. No.: 15/060,356

(22) Filed: Mar. 3, 2016

(65) Prior Publication Data

US 2016/0261248 A1    Sep. 8, 2016

(30) Foreign Application Priority Data

Mar. 4, 2015    (FR) ...................................... 15 51803

(51) Int. Cl.
*H03H 9/02* (2006.01)
*H03H 9/17* (2006.01)
(Continued)

(52) U.S. Cl.
CPC .......... *H03H 9/02574* (2013.01); *H03H 3/04* (2013.01); *H03H 9/0259* (2013.01);
(Continued)

(58) Field of Classification Search
CPC .. H03H 9/02535; H03H 9/02574; H03H 9/17; H03H 9/02551; H03H 9/0259; H03H 9/02598
(Continued)

(56) References Cited

U.S. PATENT DOCUMENTS

| | | |
|---|---|---|
| 5,446,330 A | 8/1995 | Eda et al. |
| 6,933,810 B2 | 8/2005 | Miura et al. |

(Continued)

FOREIGN PATENT DOCUMENTS

| | | |
|---|---|---|
| DE | 10 2009 001192 A1 | 10/2009 |
| EP | 0 635 938 A1 | 1/1995 |
| WO | 2014/010696 A1 | 1/2014 |

OTHER PUBLICATIONS

J. Lamb et al., "Anisotropic Acoustic Attenuation with New Measurements for Quartz at Room Temperatures," Proceedings of the Royal Society of London A, vol. 293, Aug. 1966, pp. 479-492.
(Continued)

*Primary Examiner* — Derek J Rosenau
(74) *Attorney, Agent, or Firm* — Baker & Hostetler LLP

(57) ABSTRACT

A surface elastic wave device comprises a stack including: a thin film made of a piezoelectric first material; a substrate made from a second material; and exciting means for generating at least one surface acoustic wave propagation mode in the piezoelectric film; wherein: the first material is a single-crystal material and the second material is a crystalline material, the thickness of the thin film of piezoelectric first material being smaller than or equal to 20 μm, and the first material and the second material having viscoelastic coefficients lower than or equal to those of quartz for the propagation mode induced by the exciting means.

18 Claims, 7 Drawing Sheets

(51) Int. Cl.
*H03H 9/54* (2006.01)
*H03H 3/04* (2006.01)

(52) U.S. Cl.
CPC .... *H03H 9/02551* (2013.01); *H03H 9/02598* (2013.01); *H03H 9/02606* (2013.01); *H03H 9/17* (2013.01); *H03H 9/54* (2013.01); *H03H 2003/0407* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 2002/0047497 A1* | 4/2002 | Higuchi | H03H 9/02574 310/322 |
| 2004/0135650 A1 | 7/2004 | Miura et al. | |
| 2008/0042517 A1* | 2/2008 | Stokes | H03H 9/02574 310/317 |
| 2010/0156241 A1 | 6/2010 | Suzuki et al. | |
| 2014/0130319 A1* | 5/2014 | Iwamoto | H03H 3/02 29/25.35 |
| 2014/0225684 A1* | 8/2014 | Kando | H03H 9/02559 333/195 |
| 2015/0365067 A1* | 12/2015 | Hori | H03H 9/02228 333/193 |

OTHER PUBLICATIONS

T. Pastureaud et al., "High-Frequency Surface Acoustic Waves Excited on Thin-Oriented LiNbO3 Single-Crystal Layers Transferred Onto Silicon," IEEE Transactions on Ultrasonics, Ferroelectric, and Frequency Control, vol. 54, No. 4, Apr. 2007, pp. 870-876.

I. Avramov, "Low Voltage, High Performance, GHz Range STW Clocks with BAW Crystal Stability," Proceedings of the 2005 IEEE International Frequency Control Symposium and Exposition, Aug. 2005, pp. 880-882.

T. E. Parker et al., "Saw Oscillators with Low Vibration Sensitivity," Forty-fifth Annual Symposium on Frequency Control, 1991, pp. 321-329.

S. Grousset et al., "SAW Pressure Sensor Based on Single-Crystal Quartz Layer Transferred on Silicon," 2013 Joint UFFC, EFTF and PFM Symposium, pp. 980-983.

M. Miura et al., "Temperature Compensated LiTaO3/Sapphire Bonded SAW Substrate with Low Loss and High Coupling Factor Suitable for US-PCS Application," 2004 IEEE International Ultrasonics, Ferroelectrics, and Frequency Control Joint 50th Anniversary Conference, pp. 1322-1325.

W. Steichen et al., "Composants acoustiques utilisés pour le filtrage: Revue des differentes technologies," Techniques de l'ingénieur, E 2000, pp. 1-28.

* cited by examiner

SURFACE ELASTIC WAVE DEVICE COMPRISING A SINGLE-CRYSTAL PIEZOELECTRIC FILM AND A CRYSTALLINE SUBSTRATE WITH LOW VISOELASTIC COEFFICIENTS

The field of the invention is that of surface elastic wave devices and more particularly that of surface elastic wave resonators. Such resonators have high quality coefficients (>10 000) at frequencies of a few hundred MHz to a few GHz. Their use is particularly advantageous in stable and compact oscillation loops intended for the synthesis of frequencies or time references for on-board applications.

Generally, components using surface waves commonly denoted SAW (surface acoustic wave) components are well known and have many applications. Among the latter, mention may be made of signal processing and especially bandpass filtering. These components may also form radio-frequency identification devices (SAW-tags). They may also be used to produce sensors of various physical quantities, such as temperature or pressure for example.

SAW devices are generally produced by depositing metal electrodes in the form of a network of interdigitated combs on a piezoelectric material. The latter generally consists of a single-crystal substrate such as quartz ($SiO_2$), lithium niobate ($LiNbO_3$), lithium tantalate ($LiTaO_3$) or more recently langasite ($La_3Ga_5SiO_{14}$). More marginally, they may also be produced on thin layers deposited by various techniques, such as aluminum nitride (AlN) or zinc oxide (ZnO). Single-crystal piezoelectric substrates are generally available in the form of substrates (or wafers) of 100 mm ("4 inches") diameter oriented at particular angles in order to optimize the properties of the surface waves. For quartz, the most common orientations are the cuts AT, ST, SC, BT etc. The cuts thus named correspond to reticular planes defined by angular rotations about X, Y, Z axes allowing the state of the blank with respect to standard IEEE Std-176, version 1949 (Std-176 IRE) to be described. In this standard, the AT cut corresponds to what is referred to as a YX blank (the Y-axis is orthogonal to the plane of the blank—collinear to its thickness—and the X-axis is defined along the length of the blank) turned by 36° about the X-axis. It is designated by the nomenclature (YXl)/35.25°. The ST cut corresponds to the nomenclature (YXl)/42.75°, the BT cut to (YXl)/−49°, and as for the SC cut, it is achieved by two successive rotations, one by 21.9° about the Z-axis and the second by 34° about the X-axis: nomenclature (YXwl)/21.9°/34°. Each cut corresponds to particular elastic propagation conditions that directly impact the characteristics of the devices.

In particular, the choice of a substrate, and substrate crystal orientation, used to produce an SAW device is dictated by a certain number of criteria, the following two being the main ones considered for filtering applications:

electromechanical coupling coefficient (0%<$k^2$<100%), which represents the efficiency of conversion of electrical energy into acoustic energy and vice versa, and which characterizes the maximum relative band that it is possible to produce for given losses; and frequency temperature coefficient (FTC expressed in ppm/K), which expresses the thermal stability of the resonator.

For applications of resonators as frequency sources, the following are also taken into account:

power flow angle, which represents the separation between the direction of propagation of the surface wave (wave vector) and the direction of propagation of the power of this wave (Poynting vector) (see the review by William STEICHEN and Sylvain BALLANDRAS: Composants acoustiques utilisés pour le filtrage: Revue des différentes technologies, Techniques de l'ingénieur, E 2000-1-28); it is preferably zero in order to transmit a maximum of surface power to the output transducer and thus prevent the transducers having to be shifted in order to make up for this power flow angle and maximize operation of the transducers, but this separation is potentially geometrically compensatable;

reflection coefficient from a single "obstacle" such as an electrode, etched groove or any other elementary structure the characteristic period of which corresponds to what is referred to as the Bragg condition, namely a half wavelength that affects how effectively Bragg gratings confine electroacoustic energy in the plane, this coefficient plays an important role in the optimization of the quality coefficient of SAW resonators;

propagation speed, which mainly affects the dimensions of the resonator and manufacturing capability at a given frequency; and transducer directivity, which it is sought to minimize or maximize depending on whether a pure mode or a natural directional effect is desired (in particular useful for certain filters).

Lithium tantalate and lithium niobate are, in general, used in the manufacture of radio-frequency (RF) SAW filters with relative bands comprised between 1 and 10%, for which filters electromechanical coupling of higher than 1% is desirable. Nevertheless, the temperature drift to which these substrates are subject is too substantial for them to be used as frequency sources.

In contrast, not only is the stability of the frequency of quartz with temperature noteworthy, its electromechanical coupling is also suitable for narrow-band applications of the resonator type. It is very widely used for this type of application, and oscillators the frequency of which is stabilized by a surface elastic wave resonator on this type of substrate present the best phase noise/short-term stability/compactness compromise for on-board applications, and more particularly for the synthesis of frequency for radar detection. However, these oscillators could allow higher detection levels to be achieved than those obtained with those of the prior-art if the quality coefficients accessible at the present time were enhanced. By way of illustration, the maximum SAW Qf (the product of quality coefficient and frequency) achievable with quartz alone turns out to be about $10^{13}$, this corresponding to a quality coefficient of 20 000 at 500 MHz.

In this context, a substrate capable of providing suitable electromechanical coupling, having temperature characteristics allowing a frequency temperature coefficient (FTC) close to 0, or allowing positive temperatures of inversion of the frequency-temperature relationship to be achieved, and having an improved quality coefficient relative to the preceding values, would be of definite interest as it would allow frequency sources to be improved and potentially the applications of SAW devices to be extended to new opportunities.

U.S. Pat. No. 6,933,810 and the publication: Temperature Compensated $LiTaO_3$/Sapphire Bonded SAW Substrate with Low Loss and High Coupling Factor Suitable for US-PCS Application, by M. Miura et al. published in 2004 in the proceedings of the IEEE Ultrasonics Symposium, describe a substrate, for SAW applications, produced from an assembly of a lithium tantalate layer on a sapphire substrate, that could be defined as a hybrid substrate.

Nevertheless, this type of device is in no way based on the study of the propagation modes of elastic waves in such a stack and has major drawbacks, namely:

limitation of the thermal expansion of the tantalate by bonding to a sapphire substrate, sapphire being a material of low thermal expansion coefficient (TEC) and high Young's modulus (material having a high elastic rigidity), which leads to high thermal stresses appearing over a wide area of the hybrid $LiTaO_3$/sapphire substrate;

reflection of bulk waves at the bonding interface, which leads to the presence of parasitic responses during frequency characterizations of the SAW resonator; and a high frequency temperature drift in the series resonance (−15 ppm/K) and parallel resonance (−27 ppm/K) of SAW resonators using this type of substrate.

A structure has also been proposed, in the publication "High-Frequency Surface Acoustic Waves Excited on Thin-Oriented $LiNbO_3$ Single-Crystal Layers Transferred Onto Silicon" by T. Pastureaud et al., published in 2007 IEEE Transactions on Ultrasonics, in which a lithium niobate piezoelectric layer having a high coupling coefficient is added by ion implantation/fracture to a silicon substrate exhibiting a high acoustic speed for certain propagation modes. This approach especially makes it possible to produce wideband filters operating at frequencies largely exceeding one GHz.

However, such a configuration also has a certain number of drawbacks, such as for example:

a very high impact of the conductivity of the silicon substrate on the properties (electromechanical coupling, losses) of the shear mode;

limited usefulness of the devices thus produced, especially because of the limit on the maximum thickness achievable with the implantation/fracture technology employed; and the resonant frequency of the devices produced drifts too much with temperature (up to −50 ppm/K) for these devices to be used in a "source" application.

In this context, it would therefore appear to be difficult to find single-crystal piezoelectric materials offering a compromise between high intrinsic quality coefficient (higher than that of quartz and comparable to those of lithium niobate and tantalate) and frequency stability with temperature. Moreover, only very rarely are resonators on materials having high electromechanical coupling coefficients ($LiTaO_3$, $LiNbO_3$) observed to simultaneously have record quality coefficients ($Qf \gg 10^{13}$).

In order to solve the aforementioned drawbacks, the subject of the present invention is a solution allowing surface elastic wave devices to be obtained the surface waves of which are excited, guided and detected via a piezoelectric film added to a substrate of high acoustic quality allowing elastic waves to propagate without propagation losses and minimizing viscoelastic absorption effects.

More precisely, one subject of the invention is a surface elastic wave device, especially for a resonator or filter, in particular a resonator or filter with a narrow transition band of about a few percent, comprising a stack including at least:

a thin film made of a piezoelectric first material;
a substrate made from a second material; and
exciting means for generating at least one surface elastic wave propagation mode in said piezoelectric film;
characterized in that:
the first material is a single-crystal material and the second material is a crystalline material,
the thickness of the thin film of piezoelectric first material being smaller than or equal to 20 μm, and
the first material and the second material have viscoelastic coefficients lower than or equal to those of quartz for the propagation mode induced by the exciting means.

In the present invention, the assembly consisting of the thin film made of the first piezoelectric material on the substrate made of the second material is defined as a hybrid substrate.

In the context of surface elastic wave devices and more particularly in the context of surface elastic wave resonators, if it is desired to benefit from the contribution of the substrate in the improvement of the specificities of the component/resonator (to increase the quality factor, increase the coupling coefficient, minimize temperature effects, etc.), it is essential that the upper piezoelectric layer be sufficiently thin to allow the properties of said layer to be coupled with the substrate. Beyond 20 μm, the Applicant has performed simulations showing that the contribution of the substrate is negligible; the improvement in the performance of the resonator is almost zero relative to a monolithic structure comprising only the material composing the thin layer.

Advantageously, the thickness of the thin film of piezoelectric first material is smaller than or equal to 5 lambda λ, lambda being the acoustic wavelength of the majority transverse shear waves, in order to guarantee a distribution of energy between thin film and substrate allowing advantage to be taken of the noteworthy properties of the two materials thus associated.

This thickness may even be decreased to 2 lambda for waves of mainly elliptical polarization (considered as equivalent to Rayleigh waves).

According to one variant of the invention, the second material is a single-crystal material.

According to variants of the invention, the film of single-crystal first material makes direct contact with the substrate made from the second material.

Direct contact makes continuity on the atomic scale possible, which promotes a purely elastic interaction at the interface. This results in an assembly of composite materials that forms a medium in which elastic waves can propagate without energetic losses.

Direct contact thus has advantages relative to a contact via organic materials. Specifically, the presence of organic materials on the path of the wave induces elastic-wave thermoacoustic conversion effects, because of the viscosity properties (most organic materials have viscoelasticity coefficients tg(delta) characterized by the ratio of the imaginary and real parts G" and G', respectively, of their shear constant G=G'+jG" lower than or equal to 100 over the entire range of the very high and ultrahigh frequencies (VHF-UHF). This constant is inversely proportional to the ability of the film to convert elastic energy into thermal energy.

The equivalent coefficients of single-crystal materials, in particular those of quartz, correspond to values ranging from 10 000 000 to 1000 for frequencies increasing from 1 MHz to 10 GHz. The energy conversion effect induced by the presence for example of a polymer on the path of the wave immediately results in a significant decrease (which may reach a few orders of magnitude depending on the volume of the material passed through by the wave) of the quality coefficient of a resonator based on an assembly of materials such as proposed in the invention.

According to variants of the invention, the surface elastic wave device may also comprise at least one inorganic film between the film of single-crystal first material and the substrate of second material.

It may comprise an inorganic first film intermediate between the substrate and the piezoelectric film, ensuring the bonding of said film to said substrate.

It may also comprise a second intermediate film made of metal located between the substrate and the piezoelectric film, the thickness and nature of which film allow the frequency temperature coefficient of the propagation mode to be adjusted.

Generally, organic materials have less favorable acoustic properties (systematically higher losses and attenuation) than solid inorganic materials. Organic materials degrade more rapidly over time (fatigue, structural degradation of organic bonds).

In addition, the implementation of ultra-thin layers (thickness smaller than about 10 μm, with a TTV (total thickness variation) thickness uniformity smaller than 500 nm) of organic adhesive materials is difficult, whereas thickness control is essential:

to benefit from thin piezo layer/substrate coupling the intermediate layers must not be too thick, typically no thicker than 10 μm; and to limit the effects of modal dispersion that hampers frequency control and the overall electrical response of the device.

The uniformity of the stack must be controlled guaranteeing lossless wave propagation without deformation of the acoustic wave.

Direct molecular bonding of inorganic dielectrics and direct metal bonding are accomplished via different mechanisms (reconfiguration of hydrophilic bonds or diffusive mechanisms) than the formation of covalent bonds, which are much stronger than organic bonds over thicknesses notably smaller than 1 μm (very much smaller than the acoustic wavelength). In addition, the deposition methods (PVD, CVD, etc.) allow the thicknesses of said layers to be almost perfectly controlled (to the nanometer).

The substrate may itself be on any carrier.

According to one variant of the invention, the device comprises a first film intermediate between the substrate and the piezoelectric film, ensuring the bonding of said film to said substrate.

According to one variant of the invention, the device includes a second intermediate film made of metal located between the substrate and the piezoelectric film, the nature of which and above all the thickness of which film allows the frequency temperature coefficient of the propagation mode to be adjusted.

According to one variant of the invention, the first material is quartz.

According to one variant of the invention, the first material is one of the following materials: $GaPO_4$ or doped $SiO_2$, or langasite (LGS—$La_3Ga_5SiO_{14}$), langatate (LGT—$La_3Ga_{5.5}Ta_{0.5}O_{14}$), langanite (LGN—$La_3Ga_{5.5}Nb_{0.5}O_{14}$)), or $Sr_3NbGa_3Si_2O_{14}$ (SNGS), or $Ca_3NbGa_3Si_2O_{14}$ (CNGS), or $Ca_3TaGa_3Si_2O_{14}$ (CTGS), or $Sr_3TaGa_3Si_2O_{14}$ (STGS) or $Ca_3TaAl_3Si_2O_{14}$ (CTAS)).

According to one variant of the invention, the second material is sapphire. Advantageously, its crystal orientation may be a C-plane, or R-plane, or M-plane or A-plane orientation.

The C-type orientation corresponds to a blank with the Z-axis or optical axis C normal to the surface also defined by the Miller indices (001), defined as a (ZX) or (YXl)/90° cut in standard IEEE Std-176; the R-type orientation corresponds to a Y cut turned by 33° about the X-axis corresponding to the indices (102), which cut is denoted (YXl)/33° according to standard Std-176 IEEE; the M-type orientation corresponds to a (YX) blank cut corresponding to the indices (010) denoted (YX) in Std-176; and the A-type orientation corresponds to a (120) orientation.

According to one variant of the invention, the second material is lithium niobate or lithium tantalate.

According to one variant of the invention, the lithium niobate substrate has a cut chosen from the following: a (YX) cut, a (YX/)/±41° cut, a (YXl)/+64° cut and a (YXl)/+128° cut to within a tolerance of ±5° about these crystal orientations, defined according to standard IEEE Std-176.

According to one variant of the invention, the lithiumtantalate substrate has a cut chosen from the following: an (XY) cut, a (YX/)/+36° cut, a (YXl)/+42° cut and a (YXl)/+θ cut where θ is comprised between 30° and 50°.

According to one variant of the invention, the thin film has a thickness comprised between about 1 μm and about 20 μm.

Another subject of the invention is a filter or resonator comprising a device according to the invention.

Yet another subject of the invention is a process for manufacturing an elastic wave device according to the invention, characterized in that it comprises:

the transfer of a first substrate comprising said piezoelectric first material to a second substrate comprising said second material;

an operation of thinning said first substrate to define the film of piezoelectric first material; and producing means for exciting said piezoelectric first material on said film of first material.

According to one variant of the invention, the transferring step includes a step of bonding by direct hydrophilic bonding via a dielectric layer, which will possibly be made of $SiO_2$, deposited on the first and/or second substrate(s).

According to one variant of the invention, the transferring step includes a step of bonding by direct hydrophilic bonding or by bonding assisted by thermocompression, via a metal layer, which will possibly be made of gold, deposited on the first and/or second substrate(s).

The invention will be better understood and other advantages will become apparent on reading the following non-limiting description, and by virtue of the appended figures, in which.

Figure 3:
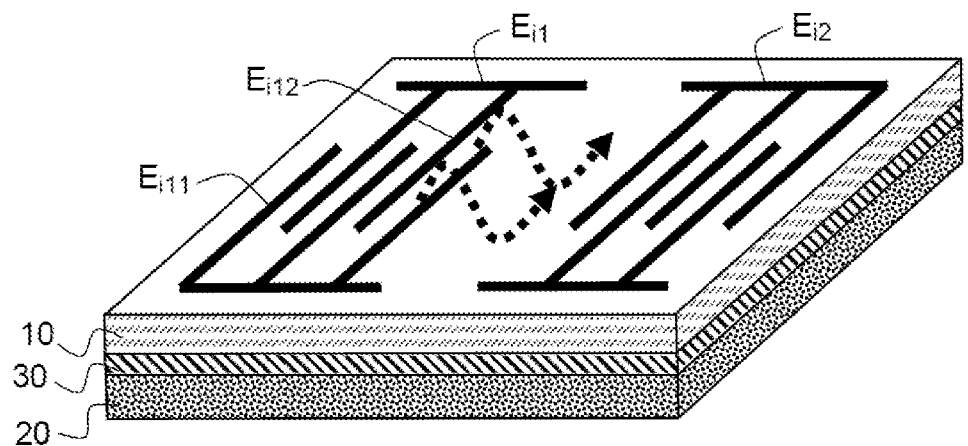
Figure 4:
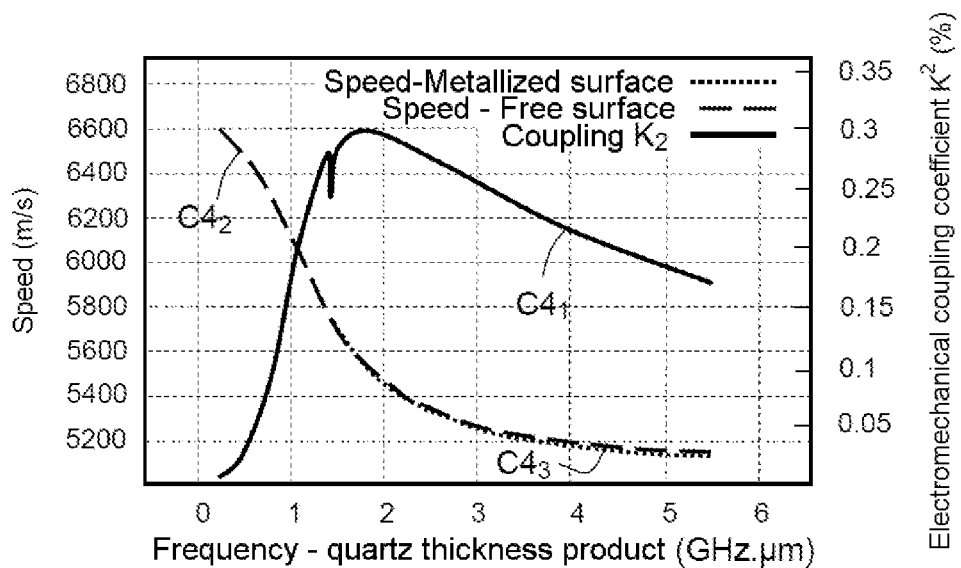
Figure 5:
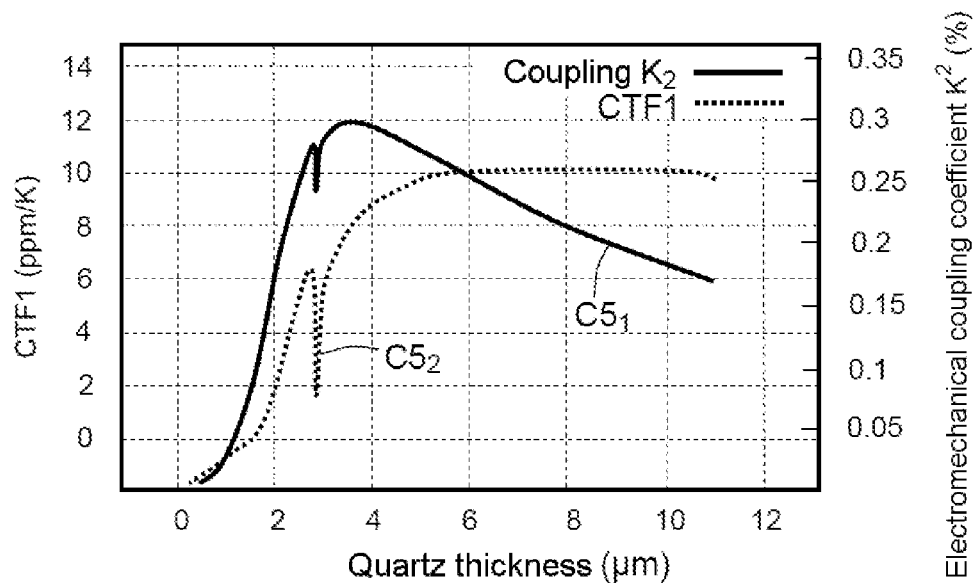
Figure 6:
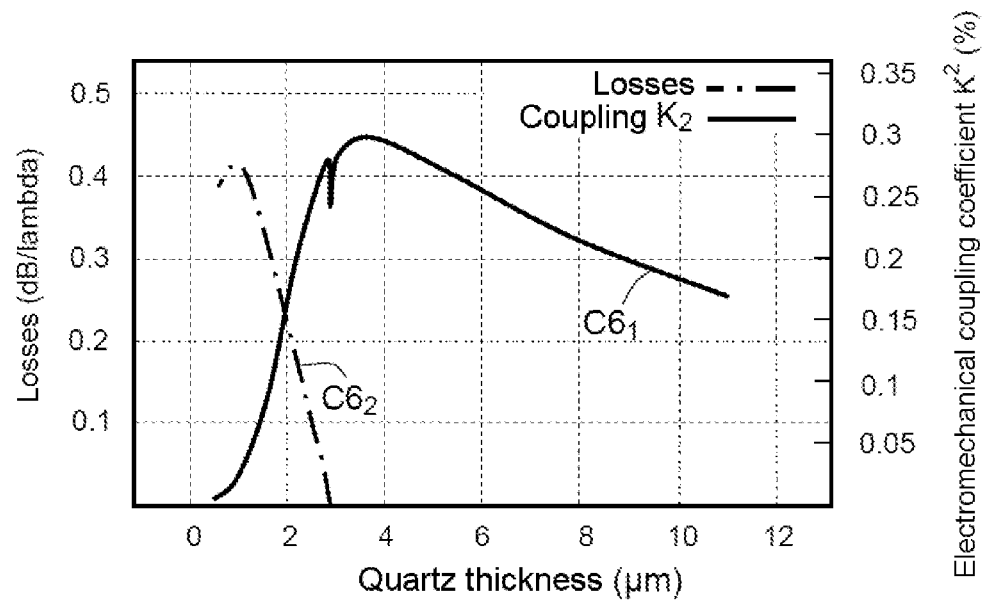
Figure 7:
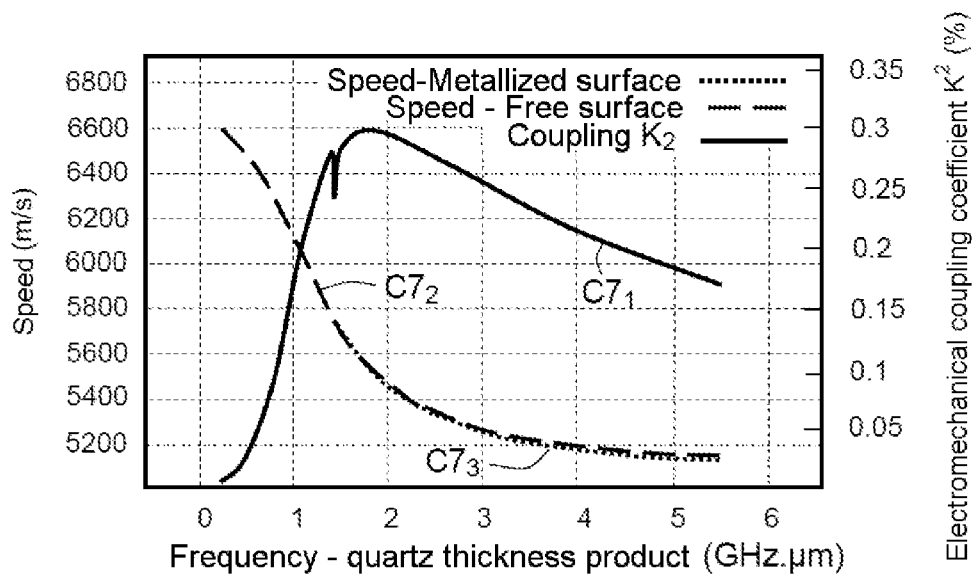
Figure 8:
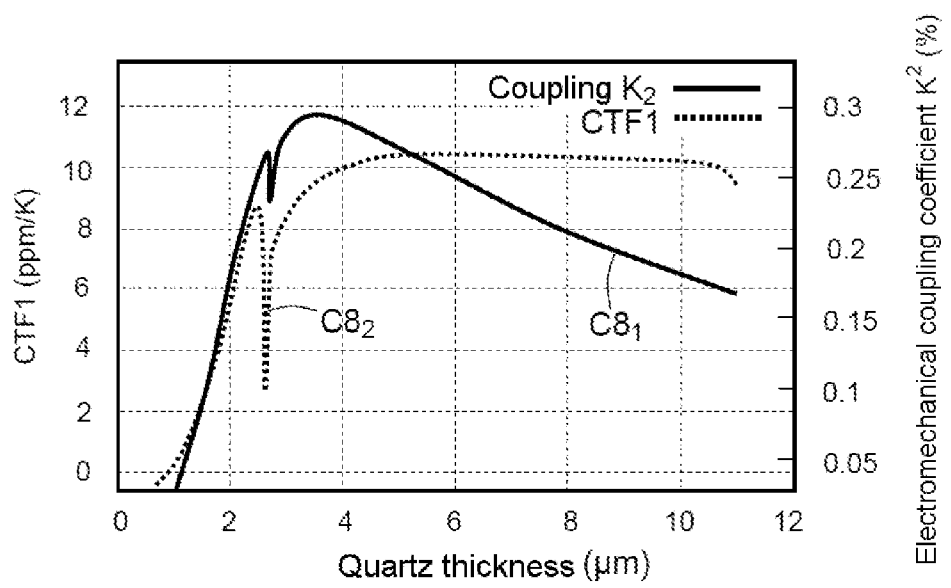
Figure 9:
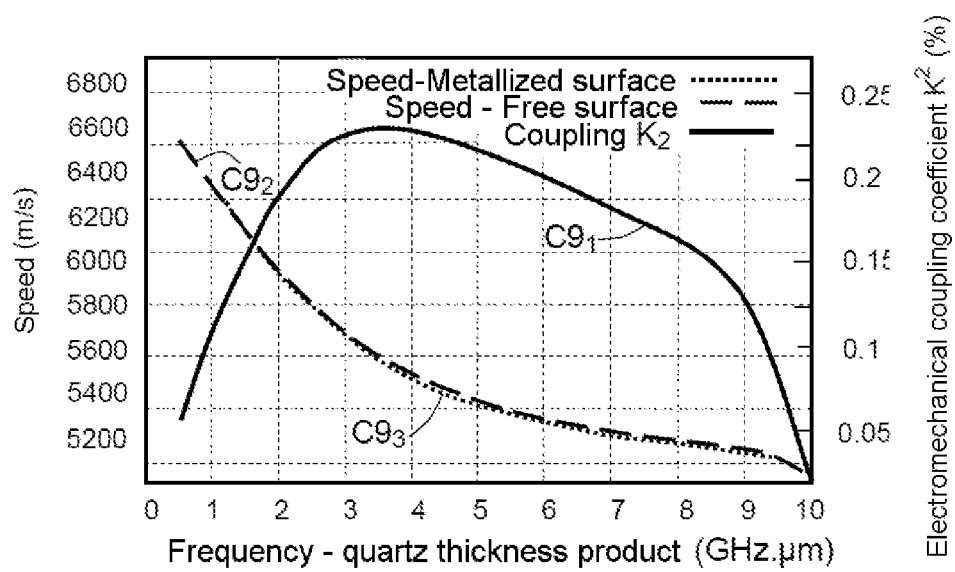
Figure 10:
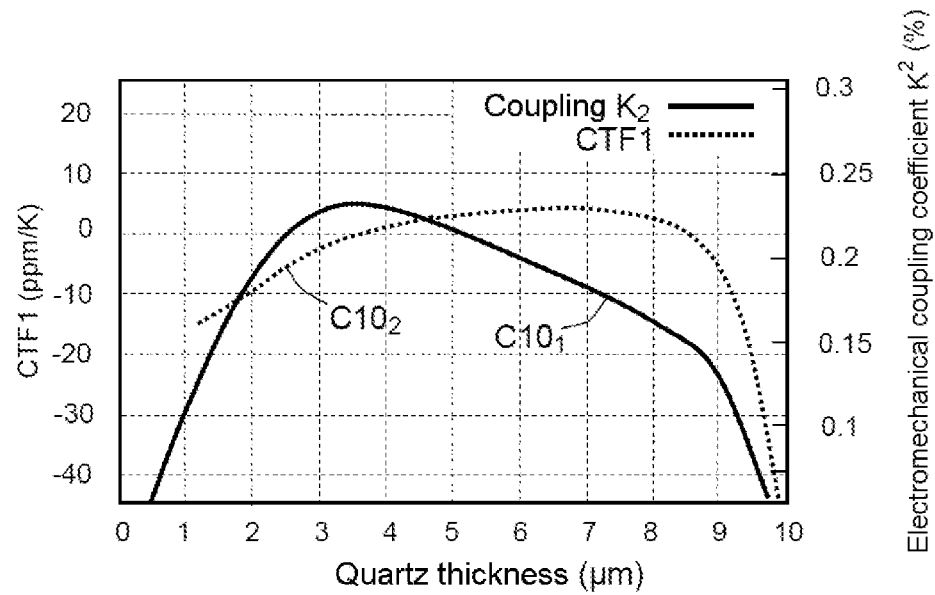

FIG. 3 schematically shows a constituent stack of an SAW device according to the invention;

FIG. 4 illustrates the dispersion of the shear mode (STW waves) in the case of a thin layer of (YXlt)/37°±5°/90°±2° quartz (in the notation of the 1949 revision of IEEE std-176) on a (C-plane) sapphire substrate as a function of the frequency/quartz thickness product expressed in GHz.μm (equivalent to km·s$^{-1}$);

FIG. 5 illustrates the variation in the $K^2$ coupling (%) and the $FTC_1$ coefficient (ppm/K) as a function of quartz thickness (μm) in the case of a thin layer of (YXlt)/37°±5°/90°±2° quartz (in the notation of the 1949 revision of IEEE std-176) on a (C-plane) sapphire substrate, as a function of the thickness of the quartz film (μm);

FIG. 6 illustrates the variation in the $K^2$ coupling (%) and the losses (dB/λ) as a function of quartz thickness (μm) in the case of a thin layer of (YXlt)/37°±5°/90°±2° quartz (in the notation of the 1949 revision of IEEE std-176) on a (C-plane) sapphire substrate;

FIG. 7 illustrates the dispersion of the shear mode (STW waves) in the case of a thin layer of (YXlt)/37°±5°/90°±2° quartz (in the notation of the 1949 revision of IEEE std-176) on a (C-plane) sapphire substrate comprising a layer of $SiO_2$ at the quartz/sapphire interface of 200 nm thickness;

FIG. 8 illustrates the variation in the $K^2$ coupling coefficient (%) and the $FTC_1$ coefficient (ppm/K) as a function of quartz thickness (μm) in the case of a thin layer of (YXlt)/37°±5°/90°±2° quartz (in the notation of the 1949 revision of IEEE std-176) on a (C-plane) sapphire substrate comprising a layer of $SiO_2$ at the quartz/sapphire interface of 200 nm thickness;

FIG. 9 illustrates the dispersion of the shear mode (STW waves) in the case of a thin layer of (YXlt)/37°±5°/90°±2° quartz (in the notation of the 1949 revision of IEEE std-176) on a (C-plane) sapphire substrate comprising a layer of gold at the quartz/sapphire interface of 200 nm thickness; and FIG. 10 illustrates the variation in the $K^2$ coupling (%) and the $FTC_1$ coefficient (ppm/K) as a function of quartz thickness (μm) in the case of a thin layer of (YXlt)/37°±5°/90°±2° quartz (in the notation of the 1949 revision of IEEE std-176) on a (C-plane) sapphire substrate comprising a layer of gold at the quartz/sapphire interface of 200 nm thickness.

Generally, the subject of the present invention is a surface wave device including an innovative stack in order to produce what is referred to as a "hybrid" substrate allowing devices to be produced in SAW technology on said hybrid substrate, comprising at least two elements: a piezoelectric film and a substrate of high acoustic quality.

This type of hybrid substrate makes it possible to operate at frequencies comprised between about one hundred MHz and a few GHz without major production difficulties and may be optimized for a particular application by seeking to maximize quality coefficients and to promote a coupling coefficient comprised between 0.1 and 1% and having an effective insensitivity to temperature effects (i.e. making it possible to compensate for thermoelastic effects within the device at the desired working temperature, the latter possibly conventionally being located in the range 20/120° C.).

The devices in SAW technology thus produced on such a hybrid substrate may advantageously be resonators. The judicious choice of the angular configuration, wave polarization and metallization moreover makes it possible to obtain structures of smaller size relative to the solutions of the prior art.

The material of the piezoelectric film may advantageously be quartz on account of the existence of crystal orientations that compensate temperature effects for shear surface (STW) and Rayleigh waves or that exhibit a slightly positive thermal drift for these types of waves (typically comprised between 0 and 10 ppm.$K^{-1}$).

The substrate may advantageously be made of single-crystal sapphire because of the low viscoelastic losses of this type of substrate that generally lead to very high quality coefficients ($Qf \approx 10^{14}$) being obtained.

The surface elastic waves are excited and detected on the piezoelectric film by virtue of interdigitated comb transducers (IDTs) produced from metal layers (generally made of aluminum) on the upper surface of the structure by conventional photolithography, deposition and machining technologies (of the liftoff type for example).

It will be noted that advantageous resonator features may be obtained on this type of substrate, for a certain range of thicknesses and for a range of specific crystal orientations of the piezoelectric film made of quartz. Similarly, the sapphire substrate is also chosen with a particular crystal orientation.

Figure 1A:
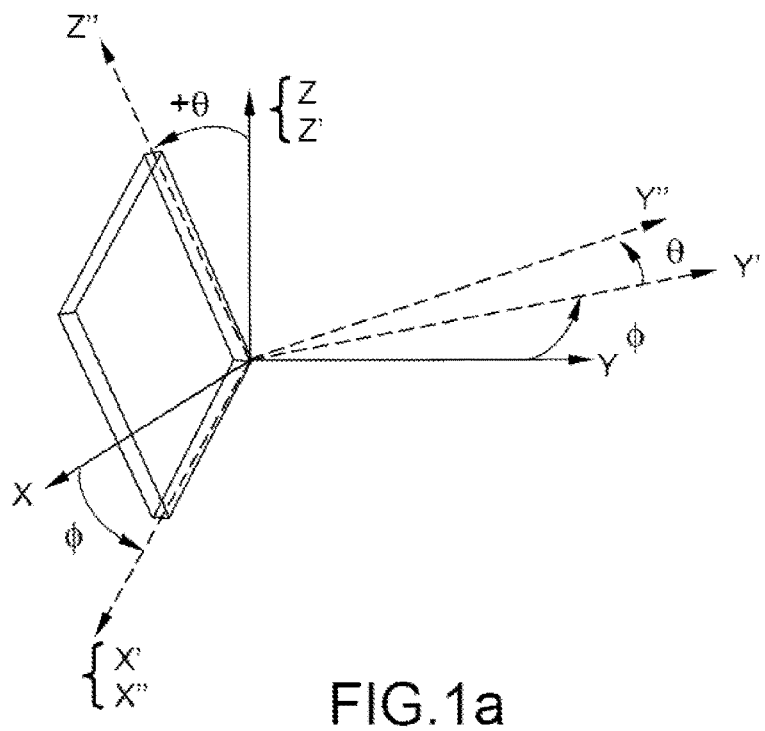
FIGS. 1a and 1b illustrate the cutting angles defined according to standard IEEE 49 (1949 revision of Std-176) and the elastic wave propagation direction.
Figure 1B:
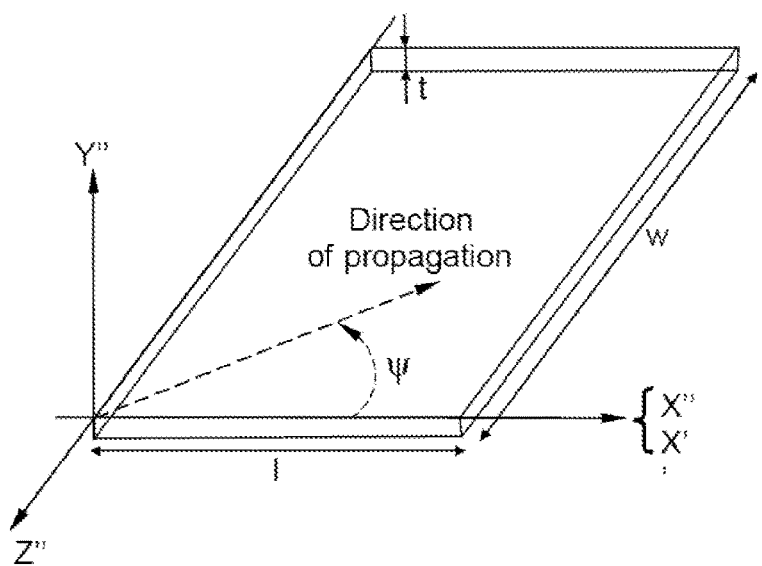

Crystal cuts are defined in the present invention according to standard IEEE 49 (the 1949 revision of Std-176, in particular as regards a consistent definition of the signs of the angles of rotation of the quartz relative to the current practice of those skilled in the art). More precisely, a crystal cut is defined by two angles of rotation. The angle φ defines the rotation about the optical axis Z and the angle θ the rotation about the X-axis. FIGS. 1a and 1b illustrate how these angles are defined in the IEEE 1949 standards.

For surface waves, a third angle, the angle denoted ψ, defines the propagation direction of the wave about the axis, denoted Y" (the initial Y-axis having undergone the two preceding rotations φ and θ), normal thereto.

Moreover:
  any cut such that φ=0 and θ≠0 is called a single rotation cut; and
  any cut such that φ≠0 and θ≠0 is called a double rotation cut.

A cut is defined in standard IEEE Std-176 by the axes defined by the thickness and length of the blank (example FIG. 1a, YX cut) and by angles of rotation about the axes defined by the width (w), the length (l) and the thickness (t) of the blank; the Z-axis is defined by the width w of the blank, the X-axis by the length and of course the Y-axis by t, these axes being understood in principle to be those after rotation, i.e. for a cut involving three rotations the rotation φ about the Z-axis (w) is first carried out, the rotation θ about the turned X-axis denoted X' (l) is then carried out and the rotation ψ about the turned Y-axis denoted Y" (t), which will therefore have undergone both of the first rotations, is lastly carried out.

Generally, combinations of materials having low viscoelastic losses may be listed exhaustively (sapphire, silicon carbide SiC, float-zone silicon FZ, single-crystal or nanocrystalline diamond carbon, garnet-type wafers—wafers of yttrium aluminum garnet YAG, yttrium iron garnet YIG, etc.—lithium tantalate and niobate), the cuts of these materials being chosen so that the phase velocity of waves propagating on their surface exceeds that of waves propagating in the quartz cuts enumerated above, namely at least 3300 m·$s^{-1}$ for Rayleigh waves and 5100 m·$s^{-1}$ for surface transverse waves (STWs).

In the present invention, a material is considered to have relatively low viscoelastic losses when its viscoelastic constants are lower than or equal to those indicated below for quartz.

TABLE 1.1

Viscoelasticity friction coefficients of quartz

|  | $\eta_{11}$ | $\eta_{33}$ | $\eta_{12}$ | $\eta_{13}$ | $\eta_{44}$ | $\eta_{66}$ | $\eta_{14}$ |
|---|---|---|---|---|---|---|---|
| Quartz | 1.37(0) | 0.96(9) | 0.73(0) | 0.71(5) | 0.36(4) | 0.302 | 0.01(2) |

The numbers between parentheses represent the decimal for which measurement uncertainty does not allow a value to be definitively defined, it is given by way of indication and gives an idea of the degree of precision of these constants.

This table gives the equivalent coefficients of viscoelastic friction (viscoelastic friction in the sense of standard modelling of the mechanics of continuous media, it is a question of an analogy with acoustics in fluids for which absolute viscosity is spoken of) for quartz ($n_{ij}$ in Ns/m$^2$) measured at 450 MHz for bulk waves.

The data originate from Lamb & Richter: J. Lamb and J. Richter, "Anisotropic Acoustic Attenuation With New Measurements for Quartz at Room Temperature," Proc. R. Soc. London, Ser. A293, pp. 479-492, 1966, for quartz.

These constants give rise to a product Qf of quality coefficient and frequency of $10^{13}$ max for Rayleigh waves: T. E. Parker and J. A Greer "SAW oscillators with Low Vibration Sensitivity", Proc. of the 45th ASFC, 1991, pp. 321-329 and D. Andres and T. E. Parker "Designing smaller SAW oscillators for low vibration sensitivity", Proc. of the IEEE IFCS, 1994, pp. 352-358, and of $1.5 \times 10^{13}$ max for surface-guided shear waves in quartz: Avramov I. D. "Low voltage, high performance, GHz range STW clocks with BAW crystal stability," Frequency Control Symposium and Exposition, 2005. Proceedings of the 2005 IEEE International, vol., no., pp. 880, 885, 29-31 Aug. 2005, doi: 10.1109/FREQ.2005.1574049.

Regarding the orientations of the sapphire, the orientations of interest may be C-plane, R-plane, M-plane and A-plane orientations.

Among the orientations of interest for lithium niobate (LiNbO$_3$) and lithium tantalate (LiTaO$_3$), mention may be made of the following cuts:

| Crystal | Cut | Propagation |
|---|---|---|
| LiNbO$_3$ | Y | Z |
| | Y + 41° | X |
| | Y + 64° | X |
| | Y + 128° | X |
| LiTaO$_3$ | X | Y + 112° |
| | Y + 36° | X |
| | Y + 42° | X |
| | Y + θ | X |
| | (30° < θ < 50°) | |

Elliptical waves (Rayleigh waves) and shear waves must be taken into account and a means for predicting the quartz thickness and its crystal orientation for a given FTC must be added.

The quartz may be replaced by one of its isomorphs (GaPO$_4$, doped SiO$_2$, etc.) or by a material of the same crystal class (langasite (LGS—La$_3$Ga$_5$SiO$_{14}$), langatate (LGT—La$_3$Ga$_{5.5}$Ta$_{0.5}$O$_{14}$), langanite (LGN—La$_3$Ga$_{5.5}$Nb$_{0.5}$O$_{14}$), and generally any material of the same family, without omitting the new complex materials proposed recently by FOMOS such as Sr$_3$NbGa$_3$Si$_2$O$_{14}$ (SNGS), Ca$_3$NbGa$_3$Si$_2$O$_{14}$ (CNGS), Ca$_3$TaGa$_3$Si$_2$O$_{14}$ (CTGS), Sr$_3$TaGa$_3$Si$_2$O$_{14}$ (STGS) and Ca$_3$TaAl$_3$Si$_2$O$_{14}$ (CTAS)).

The structure of this hybrid substrate may be optimized, in order to increase the quality factor and the coupling coefficient of the resonator while minimizing or even compensating for the effects of temperature on the eigenfrequency of the resonator, by numerical simulation in which the various parameters, especially the nature of the materials, the crystal orientation of these materials and the thickness of the film of first material, are varied.

Generally, the device of the present invention thus consists in a stack of two crystalline materials, at least one of which is a single-crystal material, requiring manufacturing processes suitable for producing the hybrid substrate.

Advantageously, the employed processes use the bonding/thinning transfer technique allowing the single-crystal character of a chosen initial substrate to be preserved.

The main steps of this type of process are illustrated by virtue of FIGS. 2a to 2f.

Figure 2A:
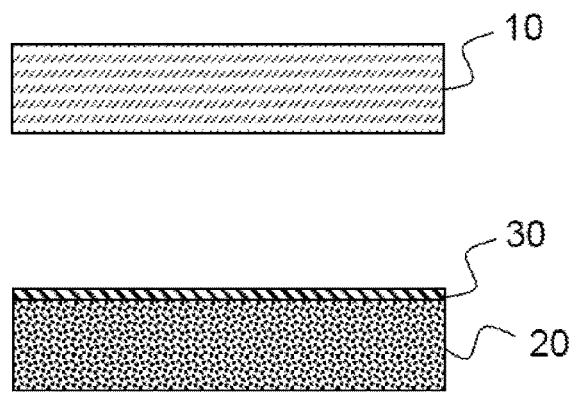
FIGS. 2a to 2f illustrate the process steps for manufacturing according to the invention an SAW device on a hybrid substrate obtained by bonding/thinning according to the prior art.

A first step illustrated in FIG. 2a, depicts the use of two substrates: a first substrate 10 made of a single-crystal piezoelectric first material and a second substrate 20 made of a crystalline second material covered with a bonding layer 30, with preparation of the surfaces intended to be facing.

Figure 2B:
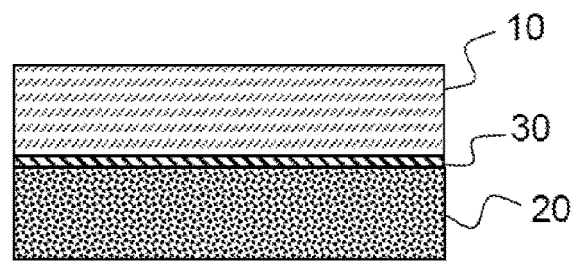

According to a second step, illustrated in FIG. 2b, the two substrates are directly bonded via the bonding layer 30.

Figure 2C:
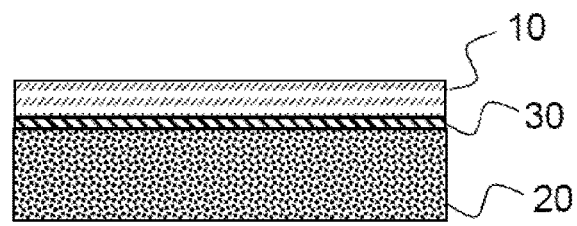

In a third step illustrated in FIG. 2c, a step of thinning the single-crystal piezoelectric substrate 10 is carried out, in order to define a thin single-crystal piezoelectric film the thickness of which is comprised between 1 and 20 μm depending on the working frequency (between 100 MHz and 3 GHz) and the targeted operating points in terms of electromechanical coupling coefficient and frequency temperature coefficient—FTC, by a mechanical grinding operation, followed by a polishing step.

Figure 2D:
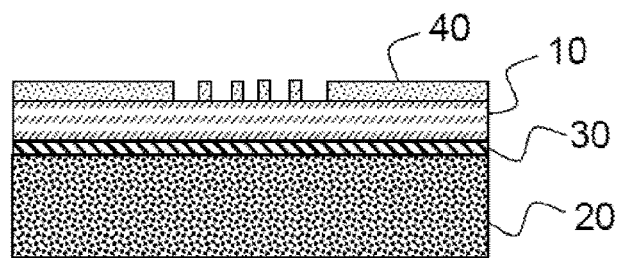

In a fourth step illustrated in FIG. 2d, a resist layer 40 is deposited, then exposed and then developed in order to define a resist mask.

Figure 2E:
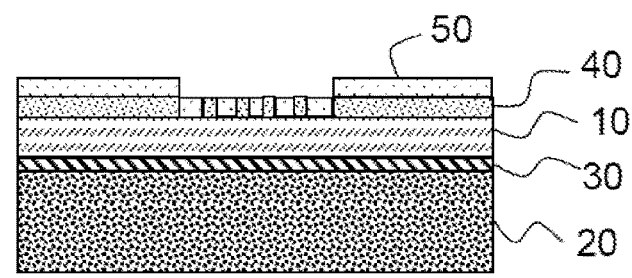

In a fifth step illustrated in FIG. 2e, a metal layer 50, intended to produce exciting means taking the form of electrodes, is deposited.

Figure 2F:
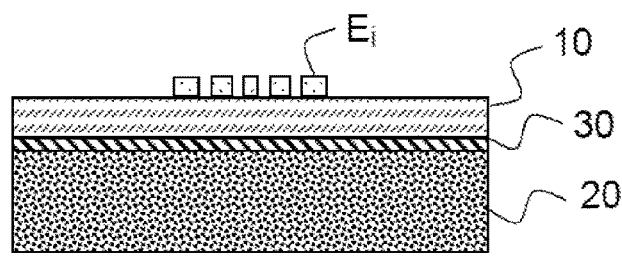

In a sixth step illustrated in FIG. 2f, the resist mask is removed, allowing electrodes Ei to be obtained on the surface of the film of single-crystal piezoelectric material, on the surface of the crystalline substrate.

FIG. 3 illustrates an exemplary configuration of electrodes produced on the surface of the hybrid substrate, depicting two sets of interdigitated electrodes Ei$_1$ and Ei$_2$ (for example the first set of electrodes comprises, interdigitated, a comb of electrodes Ei$_{11}$ and a comb of electrodes Ei$_{12}$).

The bonding/thinning technology allows without difficulty the range of quartz thicknesses possibly targeted in the present invention (1 μm<thickness <20 μm) to be achieved.

A more detailed description of the bonding/thinning approach is described in the publication by Grousset, S.; Augendre, E.; Benaissa, L.; Signamarcheix, T.; Baron, T.; Courjon, E.; Ballandras, S., "SAW pressure sensor based on single-crystal quartz layer transferred on Silicon" European Frequency and Time Forum & International Frequency Control Symposium (EFTF/IFC), 2013 Joint, vol., no., pp. 980, 983, 21-25 July 201.

Practically, it is possible to transfer the quartz substrate to the host substrate made of sapphire by way of a layer of silicon oxide (SiO$_2$) of about 100 nm located at the bonding interface. This variant is implemented by direct hydrophilic bonding.

It is also possible to transfer the quartz substrate to the host substrate made of sapphire by way of a layer of gold of thickness comprised between 40 nm and 500 nm by metal bonding (direct metal bonding or metal bonding assisted by thermocompression).

The process described above thus makes it possible to define the following stack:

a piezoelectric quartz layer obtained by mechanical thinning and chemical-mechanical polishing of the single-crystal bulk quartz substrate;

a bonding layer compatible with direct bonding or metal bonding; and a substrate made from a material of high acoustic quality comprised in the set of materials that are sapphire, LiNbO$_3$, LiTaO$_3$, YAG, etc. known for their viscoelastic coefficients 5 to ten times lower than that of quartz (see Table 1.1).

Advantageously, the structure may be composed of an $SiO_2$ or gold bonding layer that modifies only by very little the characteristics of the obtained dispersion curves. The bonding thickness is preferably smaller than one tenth of the wavelength. In the case of metal bonding, a passivation layer may advantageously be deposited on the wafer to be thinned bonding-side in order to minimize the impact of the gold layer on the final properties of the stack.

It will be noted that this thickness may be neglected in simulation operations (such as those described below) when it is smaller than one hundredth of the wavelength. It is taken into account to substantially correct the optimal thicknesses in the contrary case.

It will be recalled that the wavelength is equal to the ratio of the speed of the elastic wave to the frequency of this wave:

$$\lambda \equiv \frac{v}{f}$$

In order to optimize the electromechanical coupling coefficient and decrease losses associated with the propagation of the elastic waves, the invention is thus based on the use of elastic wave guides by producing a hybrid substrate.

The Applicants have carried out simulations on various hybrid substrates of interest for the present invention.

First Exemplary Hybrid Substrate:

The substrate consists of a thin piezoelectric film of quartz on a single-crystal substrate made of sapphire of several tens of acoustic wavelengths (ideally larger than 30 wavelengths for surface transverse waves STWs and than 15 wavelengths for waves of elliptical polarization).

In the case where the propagation mode of the surface elastic waves generated in the film/substrate assembly occurs at speeds lower than the bulk waves (of same polarization) of the substrate alone, energy unable to be radiated towards the core of the structure is guided by the substrate in the thin film.

For a wave of elliptical polarization, inhomogeneous waves are spoken of to describe the exponential attenuation, modulated by a sinusoidal function, of the wave in the substrate, whereas it is a question of evanescent waves for the shear waves. In the first case, the wave is considered to be almost attenuated at the end of two wavelengths whereas the penetration of shear waves may extend over a plurality of wavelengths. In both cases, under these conditions, waves are obtained propagating without radiative losses in the piezoelectric film and guided elastic waves are correctly spoken of.

FIG. 4 shows the results of numerical simulations of the behavior of surface transverse waves STW for a structure composed of a quartz film transferred to a sapphire substrate.

It may be observed that for frequency-thickness products higher than 2.5 GHz.μm, the mode is less and less sensitive to the presence of the substrate and behaves as in a semi-infinite quartz crystal. The curve $C4_1$ relates to the electromechanical coupling coefficient $K^2$; the curve $C4_2$ relates to the propagation speed for what is referred to as a free surface, i.e. a surface without an electrode deposition or any element liable to curtail the propagation; and the curve $C4_3$ relates to the propagation speed for an entirely metallized surface (without taking account of the grounding effect induced by such a metallization).

In contrast, for frequencies-film thicknesses smaller than 2.5 GHz.μm, the mode is very sensitive to the presence of the sapphire substrate. In particular, an electromechanical coupling maximum $K^2$ of 0.3% is observed to appear, corresponding to a frequency-quartz thickness product of about 2 GHz.μm.

In practice, for an SAW resonator operating at 500 MHz, this is equivalent to an optimum quartz thickness of 4 μm.

This particularity especially allows the operating frequency of the device and the thickness of the quartz film to be optimized in order to improve the electromechanical coupling relative to that of the layer or substrate taken individually (in the case where the substrate is piezoelectric).

FIG. 5 shows the coupling $K^2$ of the shear mode (curve $C5_1$) and the frequency temperature coefficient (to the 1st order) (curve $C5_2$) as a function of the thickness of quartz in the stack. These results show that for a quartz thickness of 4 μm, corresponding to the maximum obtainable coupling, the sensitivity to temperature obtained is relatively low (9 ppm/K) and similar to the temperature compensation, but above all is such as to allow an inversion temperature of the frequency-temperature relationship above 25° C. to be obtained, this being a key parameter for "source" applications in which the oscillator is often thermostated to temperatures exceeding its thermal operating range (−40/+85° C.). Noteworthily, a plateau in the $FTC_1$ is observed to appear at 10 ppm/K for quartz thicknesses of as much as 11 μm, while a coupling coefficient $K^2$ sufficient for the targeted resonator applications is nonetheless preserved.

Lastly, FIG. 6 shows the variation of the coupling coefficient $K^2$ of the shear mode (curve $C6_1$) and the propagation losses, expressed in dB/λ (curve $C6_2$). Thus it is confirmed that for the optimal thickness (4 μm) of the quartz film corresponding to maximum coupling, but also for the larger thicknesses, comprised between 3 μm and 11 μm, corresponding to the observed plateau in FTC, the propagation losses of the chosen shear mode are negligible (clearly lower than $10^{-3}$ dB/λ). It will be noted that the discontinuity observed in all the curves shown corresponds to the mode propagation speed equal to that of the slow bulk waves radiated by the surface, also referred to as SSBWs. Above this speed (about 5800 m·s$^{-1}$ for sapphire), the substrate no longer guides waves in the piezoelectric layer.

The innovative constituent stacks of this hybrid substrate are produced by direct bonding of the piezoelectric substrate to the substrate of high acoustic quality. Subsequently, the final thickness of 4 μm (or the thickness range comprised between 3 and 11 μm) of the quartz film is achieved by mechanical thinning then chemical-mechanical polishing.

The one-port surface wave resonators able to be produced on this type of substrate are formed from a central transduction zone (containing interdigitated combs) acting as a resonant cavity and surrounded by two reflectors (mirrors). The transducer is formed from an alternation of electrodes, which repeat with a certain periodicity called the metallization period, these electrodes being deposited on the hybrid substrate. The electrodes, which are advantageously made of aluminum (and which may be produced by photolithography and the lift-off technique) have a thickness possibly ranging from a few hundred Ångströms typically to as much as one micron.

Thus, the choice of the materials, their associations, their crystal orientations, and the layer thickness offer a large range of possibilities for optimization of the coupling coefficient and the temperature sensitivity of propagation modes suitable for certain types of applications.

Second Exemplary Hybrid Substrate:

In one variant of the invention, the structure of the hybrid substrate may comprise a silica layer ($SiO_2$) or a gold layer at the interface between the piezoelectric film of quartz and the substrate of high acoustic quality made of sapphire.

Specifically, in order to facilitate the transfer and with the objective of achieving monolithic integration of the quartz film on the sapphire substrate, it may be necessary to envision using an $SiO_2$ or gold bonding layer. This layer may advantageously be deposited, before bonding, on the piezoelectric substrate or on the substrate of high acoustic quality, or indeed on both these substrates.

In the case of use of an $SiO_2$ layer, the two substrates are assembled by direct bonding at room temperature and atmospheric pressure. The bonding is made possible by a suitable surface preparation (chemical cleaning, chemical-mechanical polishing, plasma activation) allowing the direct bonding to be achieved. It will be noted (see FIGS. 7 and 8) that the characteristics of the shear mode are almost uninfluenced by the presence of an $SiO_2$ layer of about 200 nm between the piezoelectric quartz film and the sapphire substrate.

As a function of the thickness of the quartz film, the curve $C7_1$ relates to the variation in the electromechanical coupling coefficient $K^2$; the curve $C7_2$ relates to the propagation speed for a so-called free surface; and the curve $C7_3$ relates to the propagation speed for a metallized surface.

As a function of the thickness of the quartz film, the curve $C8_1$ relates to the variation in the electromechanical coupling coefficient $K^2$; and the curve $C8_2$ relates to the frequency temperature coefficient (to the 1st order).

Third Exemplary Hybrid Substrate:

The use of a bonding layer made of gold is also possible. Gold is a particularly advantageous material for this type of bonding, on account of its plastic properties and its mechanical strength, which is high enough to ensure an acoustic joint between the piezoelectric quartz film and the high-acoustic-quality sapphire substrate. The two substrates may advantageously be bonded by thermocompression. According to FIGS. 9 and 10, the characteristics of the mode are slightly less favorable in terms of coupling than in the case of an $SiO_2$ layer, but are more advantageous in terms of temperature sensitivity with a compensation of temperature effects (FTC=0 ppm/K) obtained at the coupling maximum $K^2$ ($\approx 0.23\%$) for a quartz thickness of about 3.5 µm. Overall, this approach is also favorable to the production of resonators on this type of substrate.

As a function of the thickness of the quartz film, the curve $C9_1$ relates to the electromechanical coupling coefficient $K^2$; the curve $C9_2$ relates to the propagation speed for a so-called free surface; and the curve $C9_3$ relates to the propagation speed for a metallized surface.

As a function of the thickness of the quartz film, the curve $C10_1$ relates to the variation in the electromechanical coupling coefficient $K^2$; and the curve $C10_2$ relates to the frequency temperature coefficient (to the 1st order).

Thus, the use of resonators produced on this type of hybrid substrate may advantageously be envisioned in oscillation loops intended for the synthesis of ultrastable time references or frequencies. This type of hybrid substrate is generally advantageous for narrowband filters.

The invention claimed is:

1. A surface elastic wave device comprising a stack including at least:
    a thin film made of a piezoelectric first material;
    a substrate made from a second material;
    exciting means for generating at least one surface acoustic wave propagation mode in said piezoelectric film; and
    a second intermediate film made of metal located between the substrate and the piezoelectric film, a thickness and nature of which film allow a frequency temperature coefficient of the propagation mode to be adjusted,
    wherein:
        the first material is a single-crystal material and the second material is a crystalline material,
        the thickness of the thin film of piezoelectric first material being smaller than or equal to 20 µm, and
        the first material and the second material having viscoelastic coefficients lower than or equal to those of quartz for the propagation mode induced by the exciting means.

2. The surface elastic wave device according to claim 1, wherein the second material is a single-crystal material.

3. The surface elastic wave device according to claim 1, wherein the thickness of the thin film of piezoelectric first material is smaller than or equal to $5\lambda$, $\lambda$ being the acoustic wavelength.

4. The surface elastic wave device according to claim 3, wherein the thickness of the thin film of first material is smaller than or equal to $2\lambda$, $\lambda$ being the acoustic wavelength.

5. The surface elastic wave device according to claim 1, wherein the film of piezoelectric first material makes direct contact with the substrate made from the second material.

6. The surface elastic wave device according to claim 1, comprising at least one inorganic film between the film of single-crystal first material and the substrate of second material.

7. The surface elastic wave device according to claim 6, comprising an inorganic first film intermediate between the substrate and the piezoelectric film, ensuring the bonding of said film to said substrate.

8. The surface elastic wave device according to claim 1, wherein the first material is quartz.

9. The surface elastic wave device according to claim 1, wherein the first material is one of the following materials: $GaPO_4$ or doped $SiO_2$, or langasite (LGS-$La_3Ga_5SiO_{14}$), langatate (LGT-$La_3Ga_{5.5}Ta_{0.5}O_{14}$), langanite (LGN-$La_3Ga_{5.5}Nb_{0.5}O_{14}$)), or $Sr_3NbGa_3Si_2O_{14}$ (SNGS), or $Ca_3NbGa_3Si_2O_{14}$ (CNGS), or $Ca_3TaGa_3Si_2O_{14}$ (CTGS), or $Sr_3TaGa_3Si_2O_{14}$ (STGS) or $Ca_3TaAl_3Si_2O_{14}$ (CTAS)).

10. The surface elastic wave device according to claim 1, wherein the second material is sapphire.

11. The surface elastic wave device according to claim 10, wherein the second material has a C-plane, or R-plane, or M-plane or A-plane crystal orientation.

12. The surface elastic wave device according to claim 1, wherein the second material is lithium niobate or lithium tantalate.

13. The surface elastic wave device according to claim 12, wherein:
    the lithiumniobate substrate has a cut chosen from the following: a (YX) cut, a (YX/)/+41° cut, a (YXl)/+64° cut and a (YXl)/+128° cut to within a tolerance of ±5°; or
    the lithiumtantalate substrate has a cut chosen from the following: an (XY) cut, a (YX/)/+36° cut, a (YXl)/+42° cut and a (YXl)/+θ cut where θ is comprised between 30° and 50°.

14. A resonator comprising a device according to claim 1.

15. A frequency filter comprising a device according to claim 1.

16. A process for manufacturing an elastic wave device according to claim 1, comprising:

the transfer of a first substrate comprising said piezoelectric first material to a second substrate comprising said second material;
an operation of thinning said first substrate to define the film of piezoelectric first material; and
producing means for exciting said piezoelectric first material on said film of first material.

17. The process for manufacturing a surface elastic wave device according to claim 16, wherein the transferring step includes a step of bonding by direct hydrophilic bonding via a dielectric layer, which will possibly be made of $SiO_2$, deposited on the first and/or second substrate(s).

18. The process for manufacturing a surface elastic wave device according to claim 16, wherein the transferring step includes a step of bonding by direct hydrophilic bonding or by bonding assisted by thermocompression, via a metal layer, which will possibly be made of gold, deposited on the first and/or second substrate(s).

* * * * *